(12) United States Patent
Maeng et al.

(10) Patent No.: US 12,290,778 B2
(45) Date of Patent: May 6, 2025

(54) SCRUBBER, ALD PROCESS SYSTEM INCLUDING THE SCRUBBER AND METHOD FOR FABRICATING SEMICONDUCTOR DEVICE USING THE SCRUBBER

(71) Applicants: Samsung Electronics Co., Ltd., Suwon-si (KR); CSK Inc., Yongin-si (KR)

(72) Inventors: Seo Young Maeng, Seoul (KR); Il Jun Jeon, Hwaseong-si (KR); Su Ji Gim, Hwaseong-si (KR); Jin Hong Kim, Yongin-si (KR); Young Seok Roh, Suwon-si (KR); Jong Yong Bae, Hwaseong-si (KR); Jung Joon Pyeon, Hwaseong-si (KR)

(73) Assignees: SAMSUNG ELECTRONICS CO., LTD.; CSK Inc.

( * ) Notice: Subject to any disclaimer, the term of this patent is extended or adjusted under 35 U.S.C. 154(b) by 647 days.

(21) Appl. No.: 17/536,048

(22) Filed: Nov. 28, 2021

(65) Prior Publication Data

US 2022/0176301 A1 Jun. 9, 2022

(30) Foreign Application Priority Data

Dec. 3, 2020 (KR) .......................... 10-2020-0167460

(51) Int. Cl.
*B01D 46/76* (2022.01)
*B01D 46/00* (2022.01)
(Continued)

(52) U.S. Cl.
CPC ......... *B01D 46/76* (2022.01); *B01D 46/0036* (2013.01); *B01D 46/24* (2013.01);
(Continued)

(58) Field of Classification Search
None
See application file for complete search history.

(56) References Cited

U.S. PATENT DOCUMENTS

| 6,554,879 B1 | 4/2003 | Nomura |
| 7,988,755 B2 | 8/2011 | Cho et al. |

(Continued)

FOREIGN PATENT DOCUMENTS

| JP | 6007715 B2 | 10/2016 |
| KR | 101024504 B1 | 3/2011 |

(Continued)

*Primary Examiner* — Hsien Ming Lee
(74) *Attorney, Agent, or Firm* — Muir Patent Law, PLLC

(57) ABSTRACT

A method of fabricating a semiconductor device includes providing a wafer inside a process chamber, performing an ALD (atomic layer deposition) process inside the process chamber to deposit titanium nitride on the wafer, providing a process gas used for the ALD process to a scrubber, filtering a first powder contained in the process gas, using a filter unit disposed in the scrubber and including a plurality of filters, adsorbing a second powder remaining in the process gas after passing through the filter unit, using a fin structure extending in a vertical direction inside the filter unit, and exhausting the process gas, from which the first and second powders are removed, from the scrubber.

20 Claims, 21 Drawing Sheets

(51) Int. Cl.
  *B01D 46/24* (2006.01)
  *B01D 46/64* (2022.01)
  *B01D 53/04* (2006.01)
  *C23C 16/34* (2006.01)
  *C23C 16/44* (2006.01)
  *C23C 16/455* (2006.01)
  *H01L 21/02* (2006.01)

(52) U.S. Cl.
  CPC ......... *B01D 46/64* (2022.01); *B01D 53/0407* (2013.01); *C23C 16/34* (2013.01); *C23C 16/4412* (2013.01); *C23C 16/45544* (2013.01); *H01L 21/02186* (2013.01); *H01L 21/0228* (2013.01); *B01D 2253/10* (2013.01); *B01D 2279/51* (2013.01)

(56) References Cited

U.S. PATENT DOCUMENTS

2006/0180026 A1* 8/2006 Gu ..................... B01D 53/002
                                                              95/288
2023/0360895 A1* 11/2023 Furuya ................ C23C 16/4412

FOREIGN PATENT DOCUMENTS

| KR | 101581669 B1 | 1/2016 |
| KR | 101614853 B1 | 4/2016 |
| KR | 102073529 B1 | 2/2020 |
| KR | 102077759 B1 | 2/2020 |
| KR | 20200042383 A | 4/2020 |
| KR | 102141938 B1 | 8/2020 |

* cited by examiner

FIG. 5
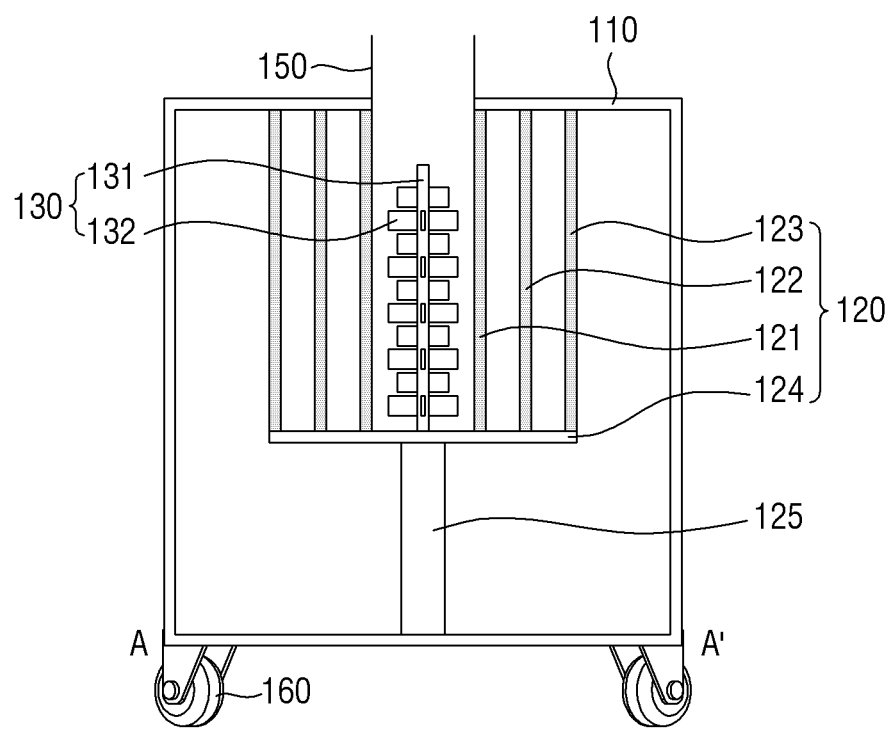
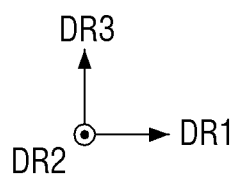

SCRUBBER, ALD PROCESS SYSTEM INCLUDING THE SCRUBBER AND METHOD FOR FABRICATING SEMICONDUCTOR DEVICE USING THE SCRUBBER

This application claims priority under 35 U.S.C. § 119 to Korean Patent Application No. 10-2020-0167460, filed on Dec. 3, 2020, in the Korean Intellectual Property Office, the disclosure of which is incorporated by reference herein in its entirety.

BACKGROUND

1. Technical Field

The present disclosure relates to a scrubber, an atomic layer deposition (ALD) process system including the scrubber, and a method of fabricating a semiconductor device using the scrubber.

2. Description of the Related Art

An ALD (atomic layer deposition) process is a process of stacking a thin film layer on a target in atomic layer units, and has an advantage in step coverage. A scrubber may be used in the ALD process. The scrubber includes a base module that processes (e.g., removes) by-products of the process in the form of powder (i.e., particles). Due to an increase in usage of process gas according to a change of semiconductor generation, there is a problem that an amount of powder increases and a maintenance cycle of the scrubber is shortened. Research for improving the powder filtering performance of the scrubbers to solve such a problem is being conducted.

SUMMARY

Aspects of the present disclosure provide a scrubber which effectively removes the powder contained in the process gas by disposing a fin structure inside a filter unit to adsorb the powder contained in the process gas used in the ALD process, an ALD process system including the scrubber, and a method for fabricating a semiconductor device using the scrubber.

Aspects of the present disclosure also provide a scrubber in which a gas inlet is disposed so that the process gas provided into the housing is not provided perpendicularly to a side wall of the filter unit to prevent a filtering efficiency of a portion of the filter unit adjacent to the gas inlet from being relatively reduced, an ALD process system including the scrubber, and a method for fabricating a semiconductor device using the scrubber.

Aspects of the present disclosure also provide a scrubber which prevents a decrease in a filtering efficiency of the filter due to adsorption of the powder by applying a physical impact or vibration to the filter unit to desorb the powder adsorbed to the filter, an ALD process system including the scrubber, and a method for fabricating a semiconductor device using the scrubber.

According to an exemplary embodiment of the present disclosure, there is provided a method of fabricating a semiconductor device, comprising providing a wafer inside a process chamber, performing an ALD (atomic layer deposition) process inside the process chamber to deposit titanium nitride on the wafer, providing a process gas used for the ALD process to a scrubber, filtering a first powder contained in the process gas, using a filter unit disposed in the scrubber and including a plurality of filters, adsorbing a second powder remaining in the process gas after passing through the filter unit, using a fin structure extending in a vertical direction inside the filter unit, and exhausting the process gas, from which the first and second powders are removed, from the scrubber.

According to an exemplary embodiment of the present disclosure, there is provided a scrubber, comprising a housing connected to a process chamber in which an ALD (atomic layer deposition) process is performed, a filter unit which is disposed inside the housing, and includes a first filter and a second filter surrounding the first filter, which filter a first powder from a process gas received from the process chamber, a gas inlet which is connected to the housing, and receives the process gas from the process chamber and provides the process gas to the filter unit, and a fin structure that extends in a vertical direction inside the first filter, and adsorbs a second powder remaining in the process gas after passing through the first filter.

According to an exemplary embodiment of the present disclosure, there is provided an atomic layer deposition (ALD) process system, comprising a process chamber in which an ALD process is performed to deposit titanium nitride on a wafer, a scrubber which is connected to the process chamber, and accommodates a process gas provided from the process chamber to remove a powder contained in the process gas, and a pump which supplies the process gas provided from the process chamber to the scrubber, wherein the scrubber includes a housing, a filter unit which is disposed inside the housing and filters a first powder of the powder from the process gas, and a fin structure which extends in a vertical direction inside the filter unit, and adsorbs a second powder of the powder remaining in the process gas after passing through the filter unit.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which:

FIG. 5 is a cross-sectional view taken along line A-A' of each of FIGS. 3 and 4;

DETAILED DESCRIPTION OF THE EMBODIMENTS

An ALD (atomic layer deposition) process is a process of stacking a film on a target in atomic layer units. For example, a process of forming the film including titanium nitride by the use of the ALD process may include a first step of supplying a first gas including a titanium precursor, a second step of removing the unreacted first gas by the use of a first purge gas, a third step of supplying a second gas including or being nitrogen ($N_2$) to form a film of an atomic layer level including titanium nitride on the target, and a fourth step of removing the unreacted second gas by the use of a second purge gas.

By repeatedly performing the first to fourth steps inside the process chamber in situ, a film of a desired thickness may be formed on the target.

Hereinafter, a scrubber according to some embodiments of the present disclosure and an ALD process system including the scrubber will be described referring to FIGS. 1 to 6.

Figure 1:
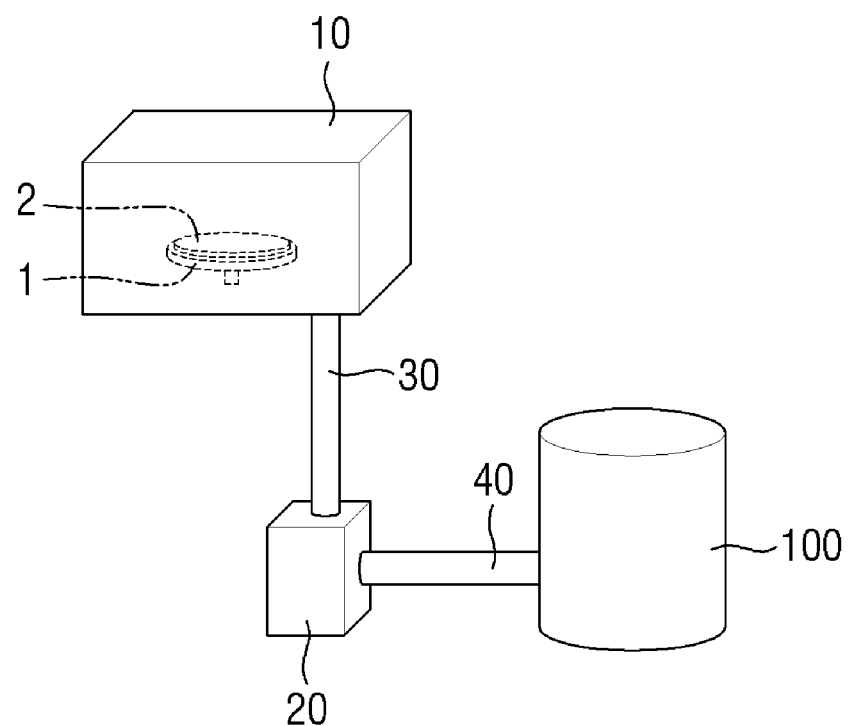
FIG. 1 is a diagram for schematically explaining an ALD process system according to some embodiments of the present disclosure.
Figure 2:
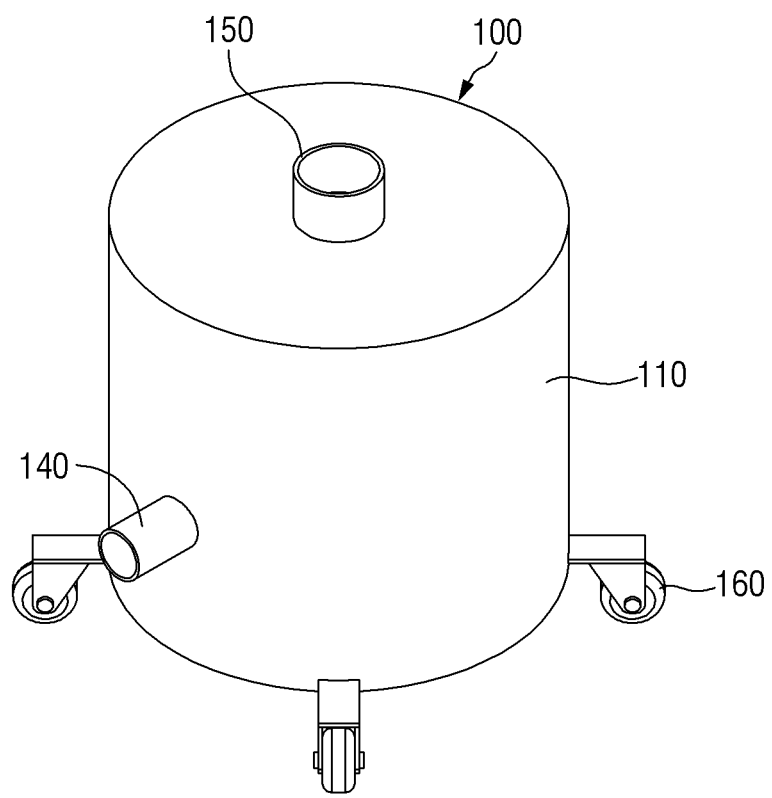
FIG. 2 is a perspective view for explaining a scrubber according to some embodiments of the present disclosure.
Figure 3:
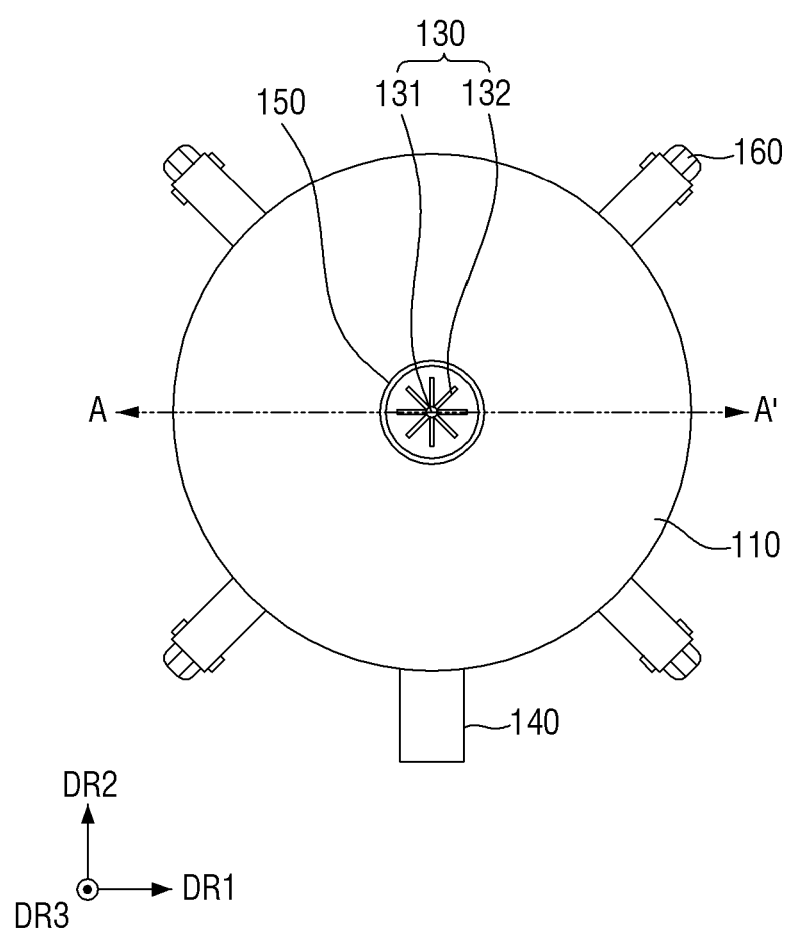
FIG. 3 is a plan view for explaining the scrubber shown in FIG. 2.
Figure 4:
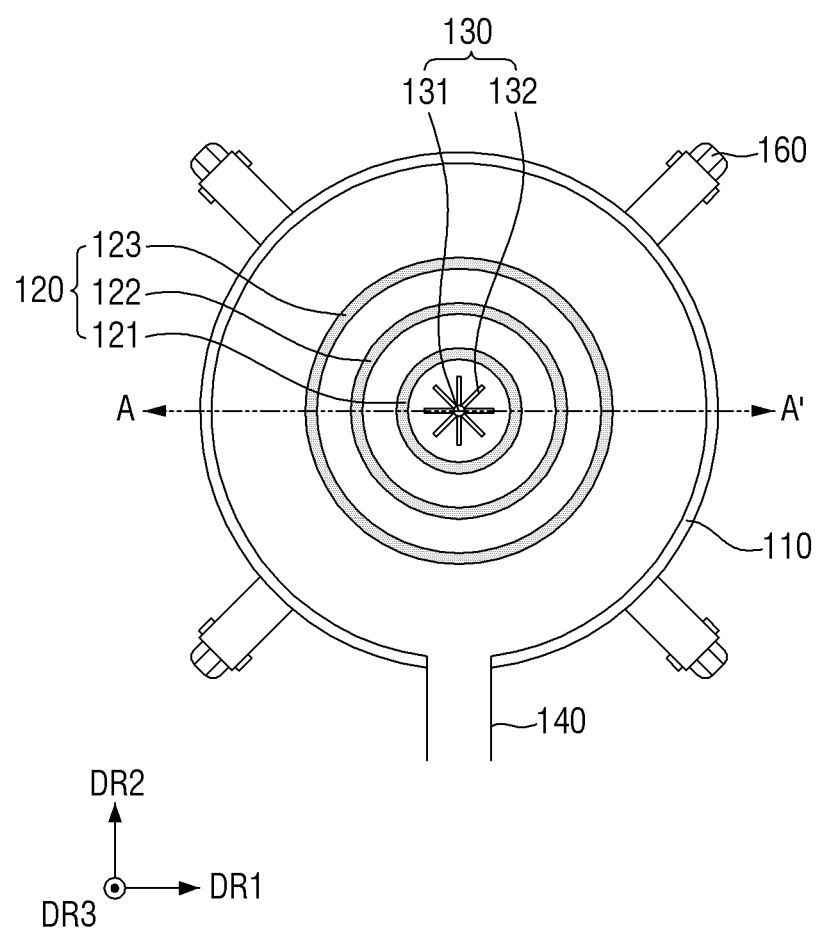
FIG. 4 is a diagram for explaining an internal structure of the scrubber shown in FIG. 2.
Figure 6:
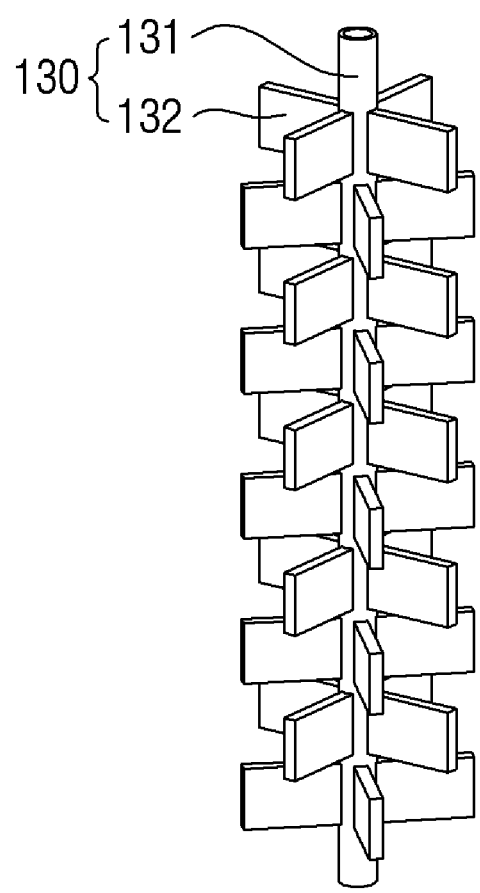
FIG. 6 is a diagram for explaining a fin structure disposed inside the scrubber shown in FIG. 2.

FIG. 1 is a diagram for schematically explaining an ALD process system according to some embodiments of the present disclosure. FIG. 2 is a perspective view for explaining a scrubber according to some embodiments of the present disclosure. FIG. 3 is a plan view for explaining the scrubber shown in FIG. 2. FIG. 4 is a diagram for explaining an internal structure of the scrubber shown in FIG. 2. FIG. 5 is a cross-sectional view taken along line A-A' of each of FIGS. 3 and 4. FIG. 6 is a diagram for explaining a fin structure disposed inside the scrubber shown in FIG. 2.

Referring to FIG. 1, the ALD process system according to some embodiments of the present disclosure may include a process chamber 10, a pump 20, a scrubber 100, a first pipe 30, and a second pipe 40.

The process chamber 10 may serve as a housing including other components inside. The process chamber 10 may be an isolated space in which an atomic layer deposition (ALD) process (hereinafter referred to as an ALD process) is performed. As the process chamber 10 is isolated from the outside, the ALD process conditions may be adjusted. For example, process conditions such as a temperature or a pressure inside the process chamber 10 may be adjusted differently from those of the outside.

A wafer 2 may be provided on a stage 1 disposed inside the process chamber 10. A film of a desired thickness may be deposited on the wafer 2 through the ALD process. For example, a film including titanium nitride (TiN) may be deposited on the wafer 2 through the ALD process. However, the present disclosure is not limited thereto. In some embodiments, the film deposited on the wafer 2 through the ALD process may include any one of metal nitrides, metal oxides, and insulating materials other than titanium nitride (TiN).

While the ALD process is in progress, the process gas used in the ALD process may be exhausted (or purged) to the outside of the process chamber 10 through the first pipe 30. The first pipe 30 may be connected between the process chamber 10 and the pump 20. The pump 20 may supply the process gas provided from the process chamber 10 to the scrubber 100 through the second pipe 40. The second pipe 40 may connect the pump 20 to the scrubber 100.

The scrubber 100 may accommodate the process gas provided from the process chamber 10 and remove the powder contained in the process gas. The process gas from which the powder is removed may be exhausted from the scrubber 100.

Although not shown in FIG. 1, additional filter unit and drug unit may be disposed in the scrubber 100. The additional filter unit may filter the powder that is not removed by the scrubber 100 and remains in the process gas. The drug unit may replace harmful gases such as $TiCl_4$ and HCl contained in the process gas with harmless gases.

Referring to FIGS. 1 to 6, the scrubber 100 according to some embodiments of the present disclosure may include a housing 110, a filter unit 120, a support 125, a fin structure 130, a gas inlet 140, a gas outlet 150, and wheels 160.

The housing 110 may have, for example, a cylindrical shape with an empty interior. The gas inlet 140 may be connected to the side wall of the housing 110. For example, the gas inlet 140 may protrude from the side wall of the housing 110 in a second direction DR2. The gas inlet 140 may, for example, overlap the filter unit 120 in the second direction DR2. However, the present disclosure is not limited thereto.

The gas inlet 140 may be connected to the second pipe 40. The process gas provided from the process chamber 10 may flow into the housing 110 through the gas inlet 140.

The filter unit 120 may be disposed inside the housing 110. The filter unit 120 may be, for example, spaced apart from a bottom face of the housing 110 in a vertical direction DR3. The filter unit 120 may be supported by the support 125 connected to the bottom face of the housing 110. For example, the support 125 may be disposed between the filter unit 120 and the bottom face of the housing 110.

The filter unit 120 may include, for example, a first filter 121, a second filter 122, a third filter 123, and a filter plate 124. Although FIGS. 4 and 5 show that the filter unit 120 includes three filters, this is an example, and the number of filters included in the filter unit 120 is not limited thereto.

The filter plate 124 may form the bottom face of the filter unit 120. The filter plate 124 may have, for example, a flat plate shape. The first filter 121 may be disposed on the filter plate 124. The first filter 121 may have a cylindrical shape with an empty interior.

The second filter 122 may be disposed on the filter plate 124. The second filter 122 may surround the first filter 121 on a plane defined by the first direction DR1 and the second direction DR2. The second filter 122 may be spaced apart from the first filter 121.

The third filter 123 may be disposed on the filter plate 124. The third filter 123 may surround the second filter 122 on the plane defined by the first direction DR1 and the second direction DR2. The third filter 123 may be spaced apart from the second filter 122. For example, a diameter of the third filter 123 in the first direction DR1 may be the same as a diameter of the filter plate 124 in the first direction DR1. The present invention is not limited thereto. For example, the diameter of the filter plate 124 may be greater than the diameter of the third filter 123 in the first direction DR1.

Each of the first to third filters 121, 122, and 123 may be in contact with the upper face of the housing 110. However, the present disclosure is not limited thereto. In some embodiments, an upper filter plate may be disposed on each of the first to third filters 121, 122, and 123. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The process gas that has flowed into the housing 110 through the gas inlet 140 sequentially passes through the third filter 123, the second filter 122, and the first filter 121, and the powder may be filtered. The filtered powder may be collected in each of a space between the third filter 123 and the second filter 122, and a space between the second filter 122 and the first filter 121.

The fin structure 130 may be disposed inside the filter unit 120. Specifically, the fin structure 130 may be disposed inside the first filter 121. The fin structure 130 may extend in the vertical direction DR3. For example, the fin structure 130 may be spaced apart from the first filter 121, which is the innermost filter of the filter unit 120.

The fin structure 130 may include a fin 131 and a plurality of blades 132. The fin 131 may extend in the vertical direction DR3. For example, one end of the fin 131 may be connected to the filter plate 124. Each of the plurality of blades 132 may be connected to the side wall of the fin 131. Each of the plurality of blades 132 may protrude laterally from the side wall of the fin 131. Although each of the plurality of blades 132 may be spaced apart from each other, the present disclosure is not limited thereto.

Some powder of the process gas may sequentially pass through the third filter 123, the second filter 122, and the first filter 121 without being filtered. The fin structure 130 may adsorb the powder remaining in the process gas. Although FIG. 6 shows the fin structure 130 in which a plurality of blades 132 are formed, the present disclosure is not limited thereto. In some embodiments, a fin structure having an increased contact surface area for adsorption of the powder may be disposed inside the first filter 121.

Although the fin structure 130 may include, for example, metal, the present disclosure is not limited thereto. In some embodiments, the fin structure 130 may include or may be formed of materials which adsorb the powder contained in the process gas.

The gas outlet 150 may be connected to the filter unit 120. For example, the gas outlet 150 may be connected to the top of the first filter 121. For example, the gas outlet 150 may protrude from the upper face of the housing 110 in the vertical direction DR3. The gas outlet 150 may be disposed on the fin structure 130. For example, the gas outlet 150 may overlap the fin structure 130 in the vertical direction DR3.

The process gas from which the powder has been removed after sequentially passing through the third filter 123, the second filter 122 and the first filter 121 may be exhausted to the outside of the housing 110 through the gas outlet 150.

The plurality of wheels 160 may be connected to the bottom of the housing 110. Although FIGS. 2 and 3 show that four wheels 160 are connected to the bottom of the housing 110, this is an example, and the number of wheels connected to the housing 110 is not limited.

Hereinafter, a method for fabricating a semiconductor device according to some embodiments of the present disclosure will be described referring to FIGS. 1 to 7.

Figure 7:
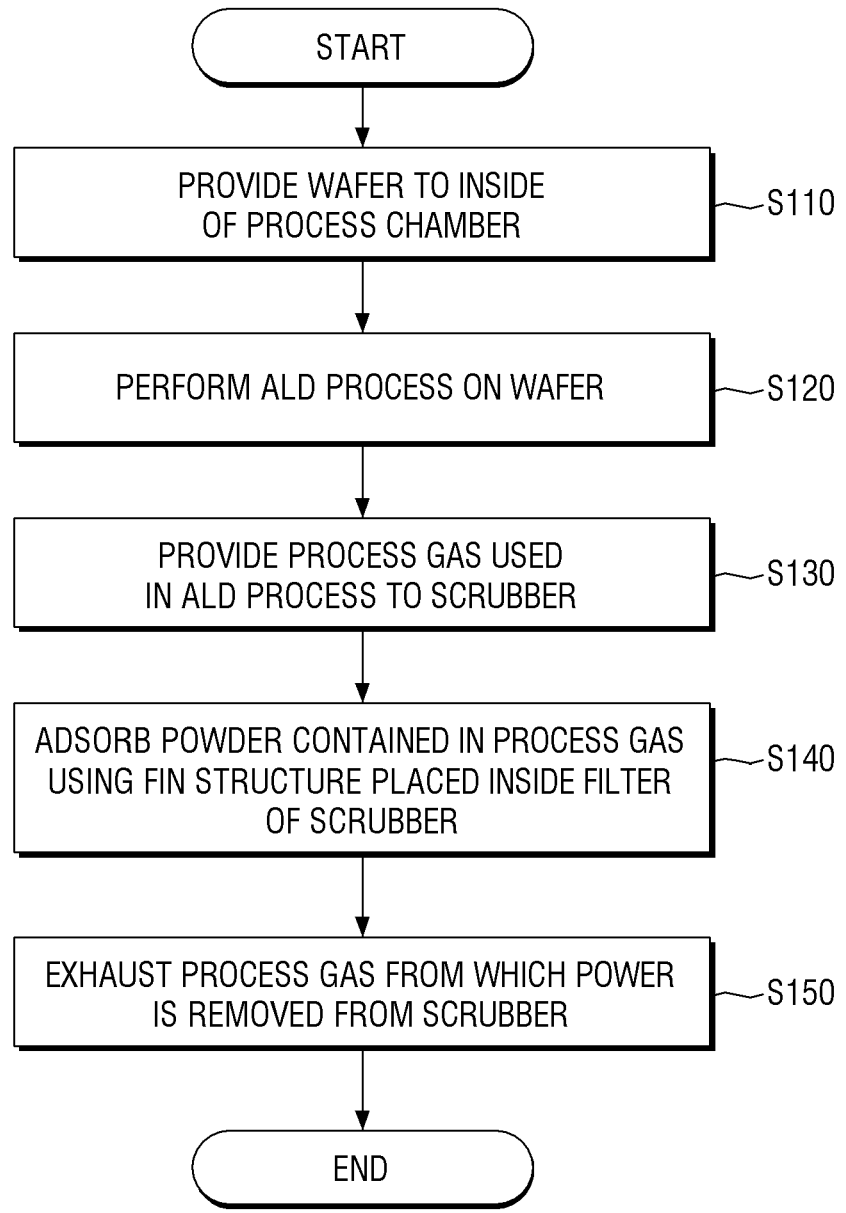
FIG. 7 is a flowchart for explaining a method of fabricating a semiconductor device according to some embodiments of the present disclosure.

FIG. 7 is a flowchart for explaining the method for fabricating a semiconductor device according to some embodiments of the present disclosure.

Referring to FIGS. 1 to 7, the wafer 2 may be provided inside the process chamber 10 (S110). The wafer 2 may be provided on the stage 1 disposed inside the process chamber 10.

Subsequently, the ALD process may be performed inside the process chamber 10 to deposit a film on the wafer 2 (S120). The film deposited on the wafer 2 may include or may be formed of, for example, titanium nitride (TiN).

While the ALD process is performed inside the process chamber 10, the process gas used for the ALD process may be provided to the scrubber 100 through the pump 20 (S130). The process gas provided from the process chamber 10 may flow into the housing 110 through the gas inlet 140. The powder contained in the process gas flowing into the housing 110 may be primarily collected in the space between the filter unit 120 and the inner wall of the housing 110.

Subsequently, the process gas may flow into the inside of the filter unit 120 through the side face of the filter unit 120. The process gas may sequentially pass through the third filter 123, the second filter 122 and the first filter 121 to filter the powder.

The powder filtered by the third filter 123 may be collected in the space between the filter unit 120 and the inner wall of the housing 110. The powder filtered by the second filter 122 may be collected in the space between the third filter 123 and the second filter 122. The powder filtered by the first filter 121 may be collected in the space between the second filter 122 and the first filter 121.

The powder remaining in the process gas that has passed through the first filter 121 may be adsorbed to the fin structure 130 disposed inside the first filter 121 (S140). Subsequently, the process gas from which the powder has been removed may be exhausted from the scrubber 100 through the gas outlet 150 (S150).

The ALD process system may include the scrubber 100, and the method of fabricating a semiconductor device may be performed using the scrubber 100 according to some embodiments of the present disclosure. The fin structure 130 may be disposed inside the filter unit 120, and may effectively remove the powder contained in the process gas.

A scrubber according to some embodiments of the present disclosure will be described below referring to FIG. 8. Differences from the scrubber shown in FIGS. 2 to 6 will be mainly described.

Figure 8:
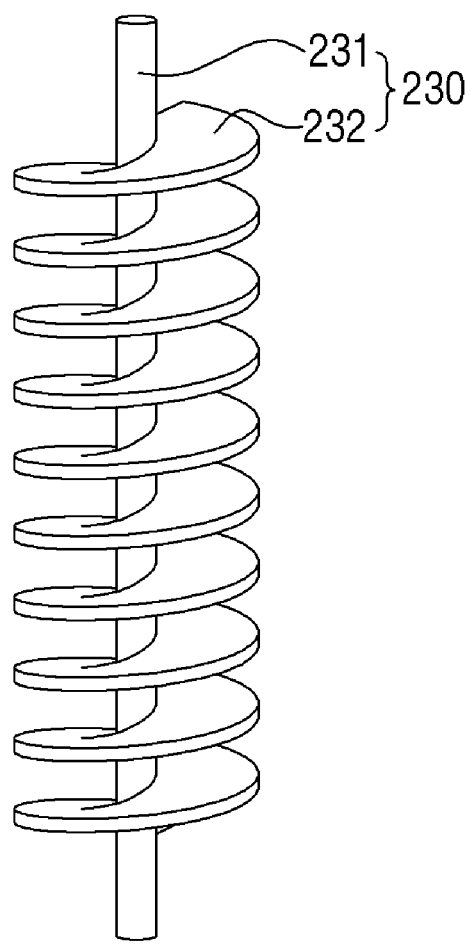
FIG. 8 is a diagram for explaining a fin structure disposed inside a scrubber according to some embodiments of the present disclosure.

FIG. 8 is a diagram for explaining a fin structure disposed inside the scrubber according to some embodiments of the present disclosure.

Referring to FIG. 8, the scrubber according to some embodiment of the present disclosure may include a fin structure 230 having a spiral shape.

The fin structure 230 may include a fin 231 and a blade 232. The fin 231 may extend in the vertical direction DR3. For example, one end of the fin 231 may be connected to the filter plate (124 of FIG. 5). The blade 232 may be connected to the side wall of the fin 231. The blade 232 may protrude laterally from the side wall of the fin 231. The blade 232 may have a spiral shape.

Hereinafter, a scrubber according to some embodiments of the present disclosure will be described referring to FIGS. 9 to 11. Differences from the scrubber shown in FIGS. 2 to 6 will be mainly described.

Figure 9:
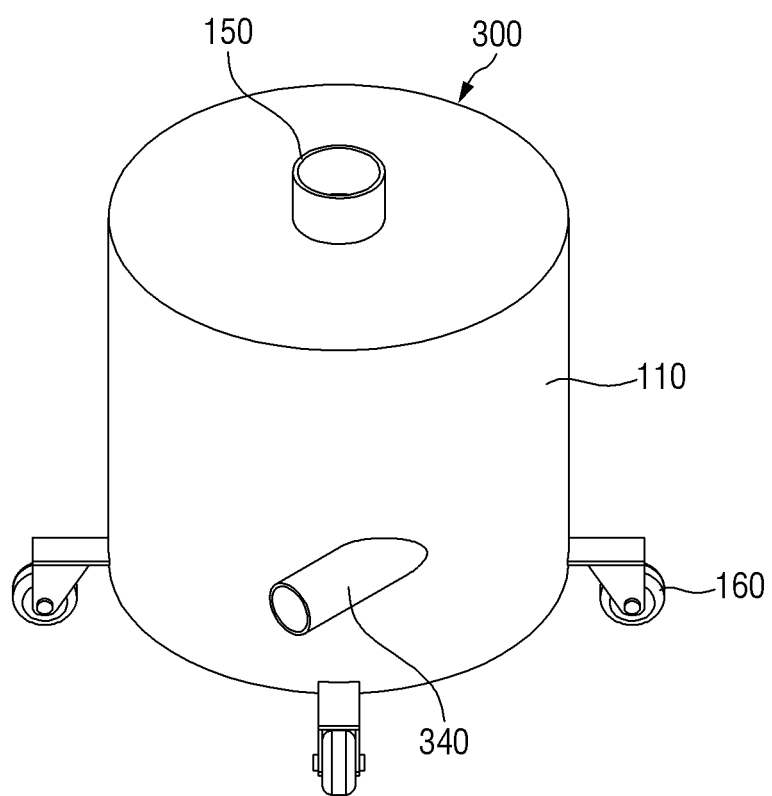
FIG. 9 is a perspective view for explaining a scrubber according to some embodiments of the present disclosure.

FIG. 9 is a perspective view for explaining a scrubber according to some embodiments of the present disclosure. FIG. 10 is a plan view for explaining the scrubber shown in FIG. 9. FIG. 11 is a diagram for explaining the internal structure of the scrubber shown in FIG. 9.

Figure 10:
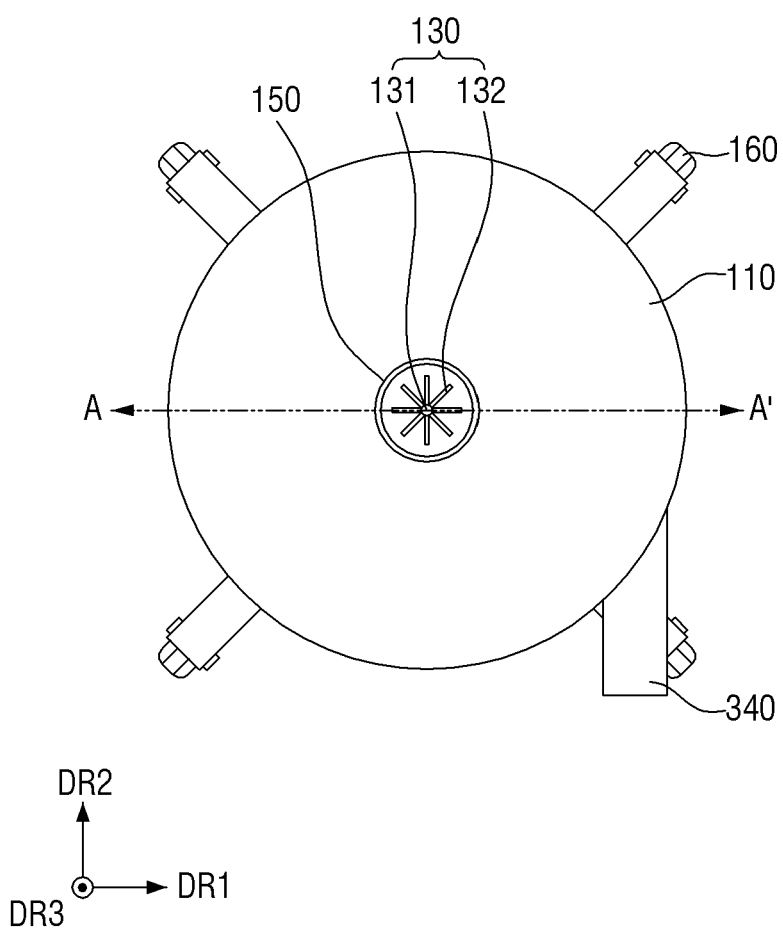
FIG. 10 is a plan view for explaining the scrubber shown in FIG. 9.
Figure 11:
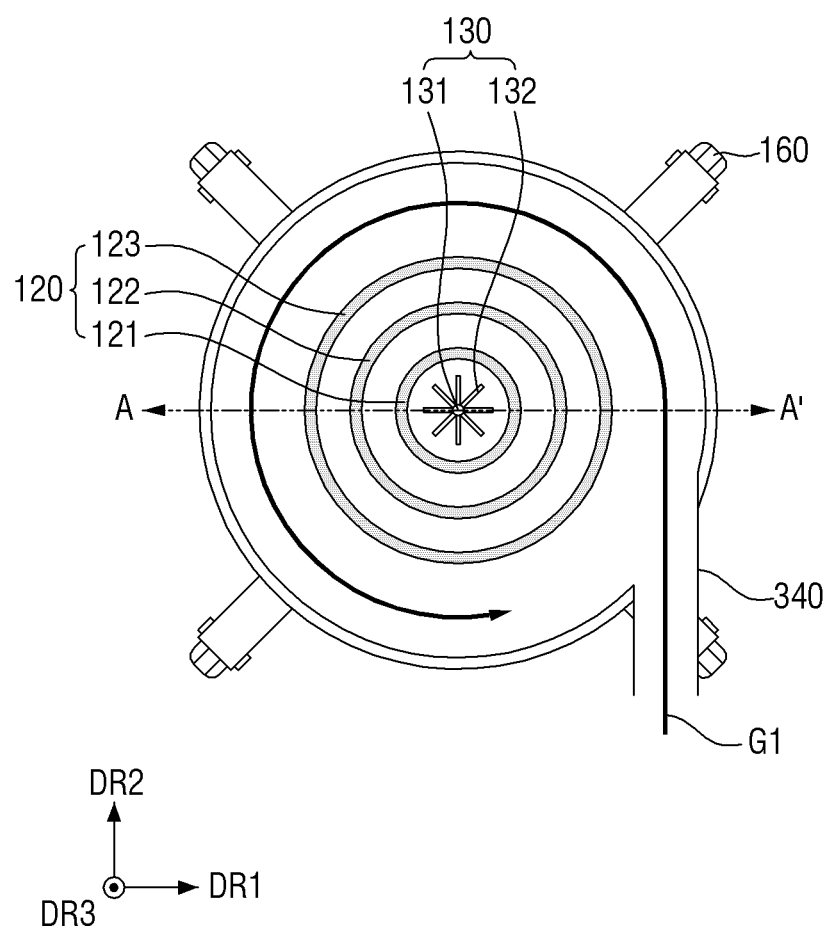
FIG. 11 is a diagram for explaining the internal structure of the scrubber shown in FIG. 9.

Referring to FIGS. 9 to 11, in a scrubber 300 according to some embodiment of the present disclosure, the process gas flows into the housing 110 through a gas inlet 340 in a second direction DR2, and the gas inlet 340 does not overlap the filter unit 120 in the second direction DR2.

The gas inlet 340 may extend, for example, in the second direction DR2 and be connected to the side wall of the housing 110. The process gas provided from the process chamber (10 of FIG. 1) may be provided to the inside of the housing 110 through the gas inlet 340 in the second direction DR2. The process gas provided to the inside of the housing 110 may circulate between the inner wall of the housing 110 and the filter unit 120 along a process gas inflow path G1.

In the scrubber 300 according to some embodiment of the present disclosure, the gas inlet 340 may be connected to the housing 110 so that the process gas provided to the inside of the housing 110 is not provided perpendicularly to the side wall of the filter unit 120 to prevent the filtering efficiency of the portion of the filter unit 120 adjacent to the gas inlet 340 from being relatively lowered.

Hereinafter, a scrubber according to some embodiments of the present disclosure will be described referring to FIGS. 12 to 15. Differences from the scrubber shown in FIGS. 2 to 6 will be mainly described.

Figure 12:
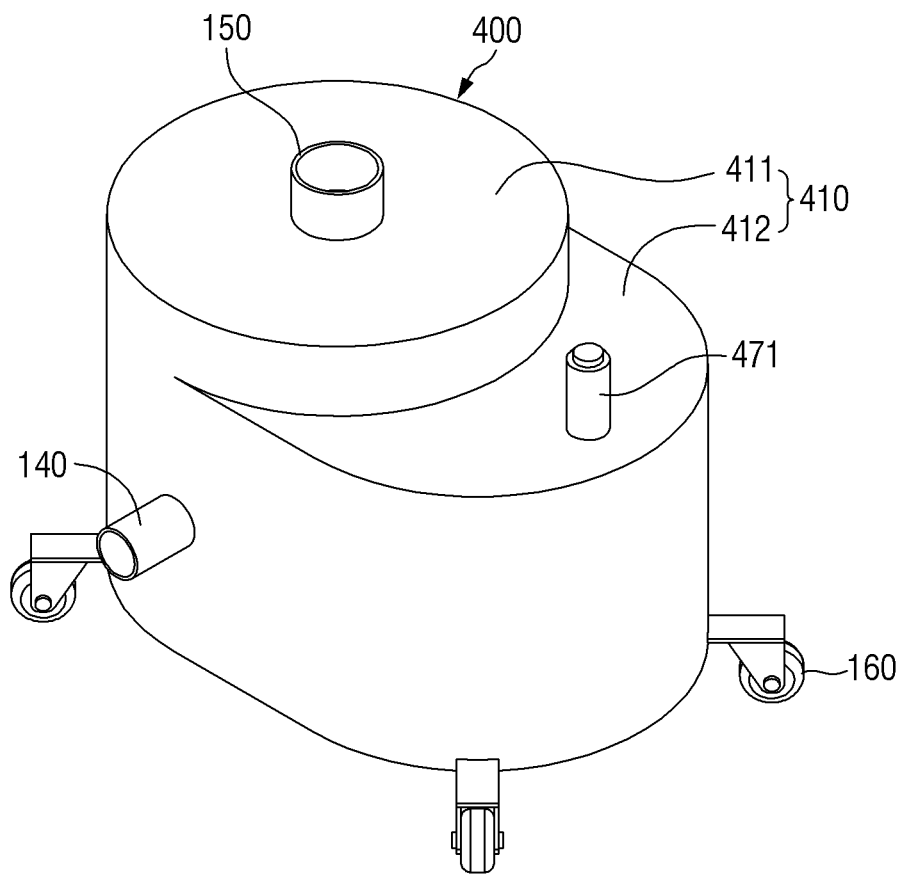
FIG. 12 is a perspective view for explaining a scrubber according to some embodiments of the present disclosure.
Figure 13:
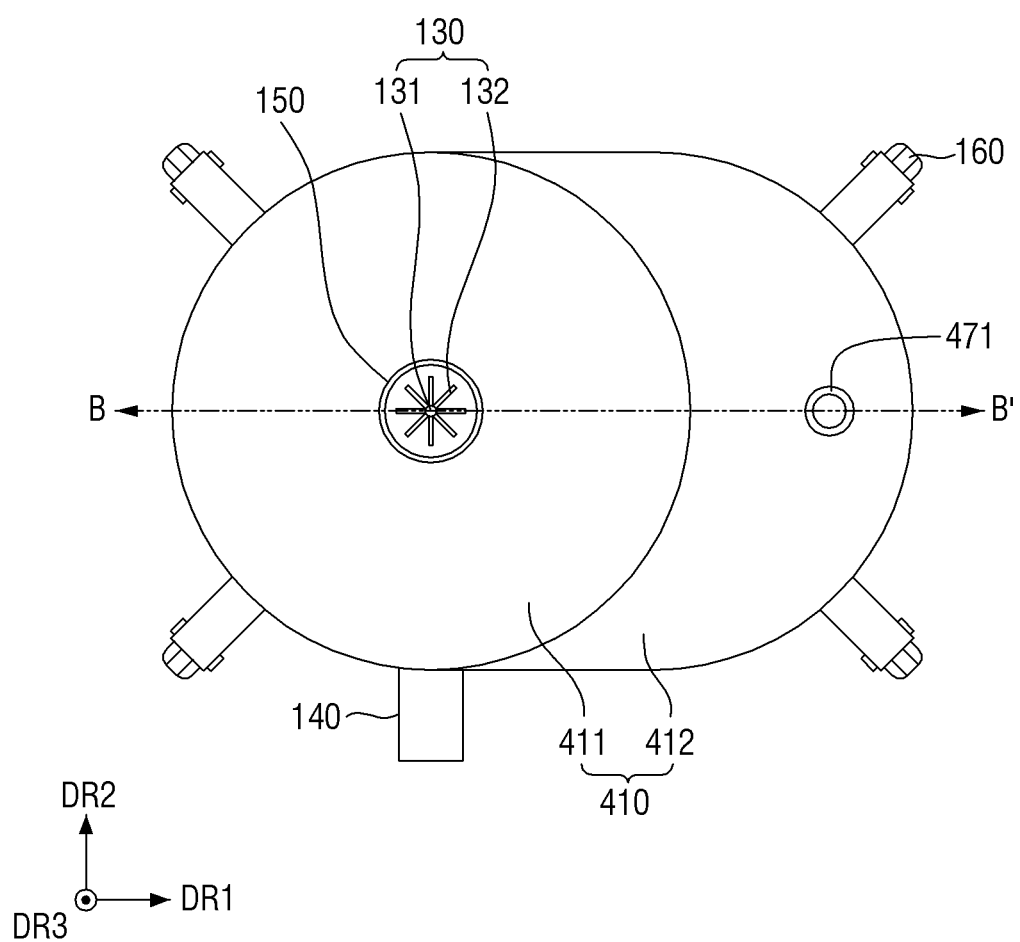
FIG. 13 is a plan view for explaining the scrubber shown in FIG. 12.
Figure 14:
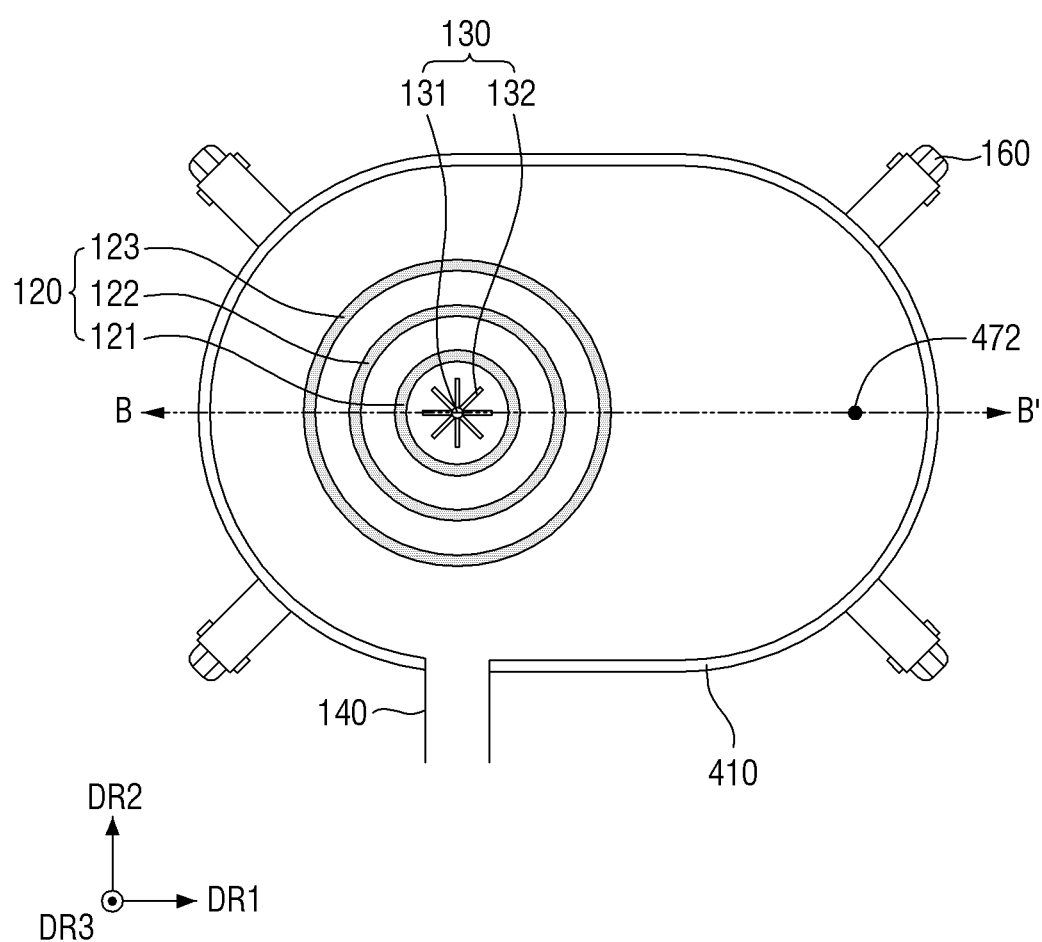
FIG. 14 is a diagram for explaining the internal structure of the scrubber shown in FIG. 12.
Figure 15:
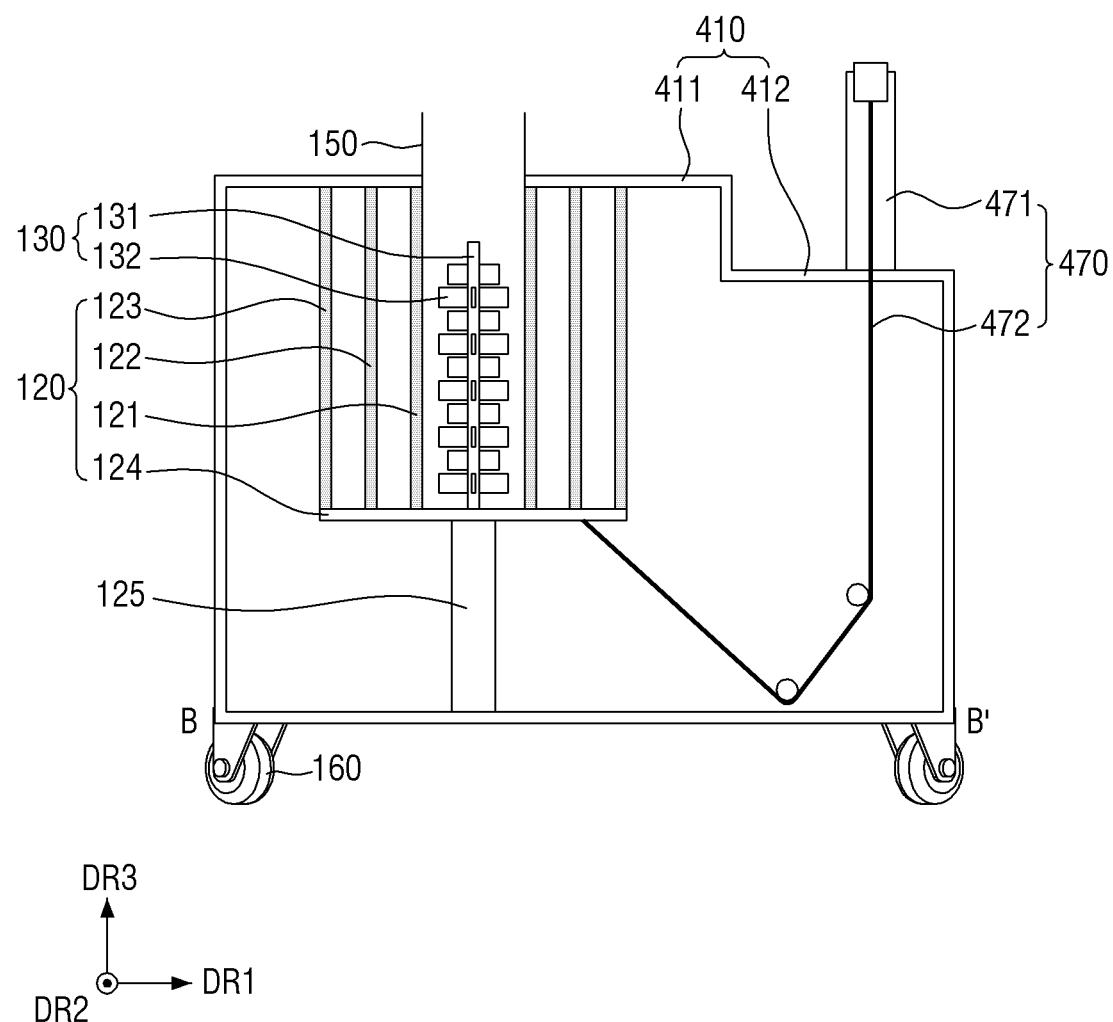
FIG. 15 is a cross-sectional view taken along line B-B' of each of FIGS. 13 and 14.

FIG. 12 is a perspective view for explaining a scrubber according to some embodiments of the present disclosure. FIG. 13 is a plan view for explaining the scrubber shown in FIG. 12. FIG. 14 is a diagram for explaining the internal structure of the scrubber shown in FIG. 12. FIG. 15 is a cross-sectional view taken along line B-B' of each of FIGS. 13 and 14.

Referring to FIGS. 12 to 15, a scrubber 400 according to some embodiment of the present disclosure may include a filter knocker 470 that operates to apply a physical impact to the filter unit 120.

A housing 410 may include a first portion 411 in which the filter unit 120 is disposed, and a second portion 412 in which a manipulation unit 471 of the filter knocker 470 is disposed. The first portion 411 of the housing 410 and the second portion 412 of the housing 410 may have a structure having connected interior.

The second portion 412 of the housing 410 may protrude laterally from the first portion 411 of the housing 410. For example, although an upper face of the first portion 411 of the housing 410 may be formed to be higher than an upper face of the second portion 412 of the housing 410, the present disclosure is not limited thereto.

The gas inlet 140 may be connected to the side wall of the first portion 411 of the housing 410. The plurality of wheels 160 may be installed in each of the first portion 411 of the housing 410 and the second portion 412 of the housing 410.

The filter knocker 470 may include a manipulation unit 471 and a drive unit 472. The manipulation unit 471 may be exposed, for example, on the outer wall of the housing 410. Although FIG. 12 shows that the manipulation unit 471 is exposed on the upper face of the second portion 412 of the housing 410, this is an example, and the present disclosure is not limited thereto.

One end of the drive unit 472 may be connected to the manipulation unit 471. The drive unit 472 may extend to the inside of the second portion 412 of the housing 410. The other end of the drive unit 472 may be connected to the filter unit 120. For example, the other end of the drive unit 472 may be connected to the filter plate 124.

The drive unit 472 may have, for example, a line shape. However, the present disclosure is not limited thereto. In some embodiments, the drive unit 472 may have other structures that may apply a physical impact to the filter unit 120.

An extending direction of the drive unit 472 may be switched by utilizing, for example, a plurality of direction switching configurations disposed inside the housing 410. However, the present disclosure is not limited thereto. In some embodiments, the drive unit 472 may extend in a certain direction and be connected to the filter unit 120.

An operator may manually manipulate the manipulation unit 471 to apply a physical impact to the filter unit 120 through the drive unit 472. However, the present disclosure is not limited thereto. In some embodiments, the manipulation unit 471 may be automatically manipulated through a control system.

The scrubber 400 according to some embodiments of the present disclosure may desorb the powder adsorbed to each of the first to third filters 121, 122, and 123, by manipulating the filter knocker 470 to apply a physical impact to the filter unit 120. As a result, it is possible to prevent the filtering efficiency of each of the first to third filters 121, 122, and 123 from being lowered due to adsorption of the powder.

Hereinafter, a method of fabricating a semiconductor device according to some embodiments of the present disclosure will be described referring to FIGS. 12 to 16. Differences from the method of fabricating the semiconductor device shown in FIG. 7 will be mainly described.

Figure 16:
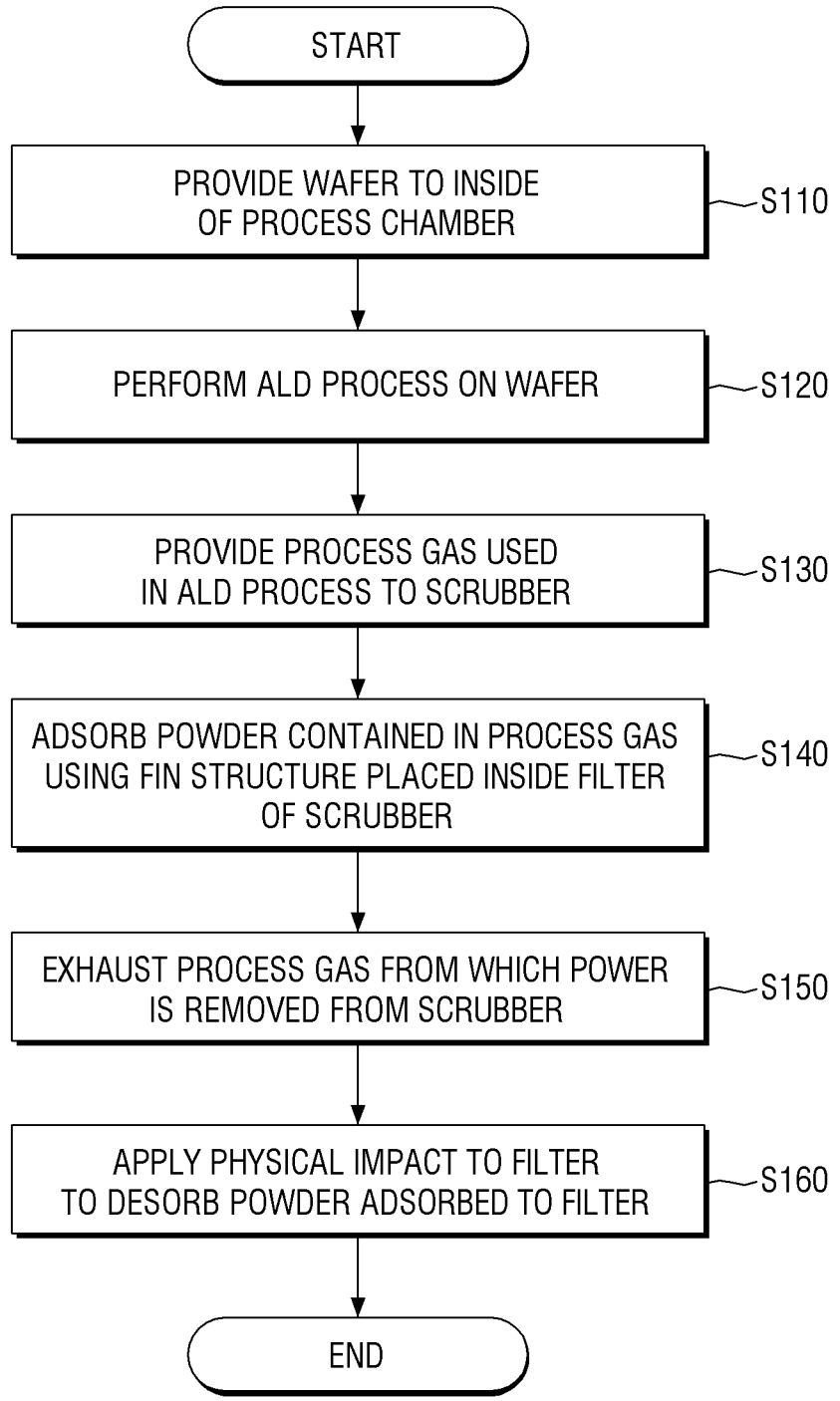
FIG. 16 is a flowchart for explaining a method for fabricating a semiconductor device according to some embodiments of the present disclosure.

FIG. 16 is a flowchart for explaining a method of fabricating a semiconductor device according to some embodiments of the present disclosure.

Referring to FIGS. 12 to 16, the process gas from which the powder has been removed is exhausted from the scrubber 100 through the gas outlet 150 (S150), and then a physical impact may be applied to the filter unit 120 using the filter knocker 470, thereby desorbing the powder adsorbed to each of the first to third filters 121, 122, and 123 (S160).

For example, application of the physical impact to the filter unit 120 using the filter knocker 470 may be performed, after the ALD process is completed inside the process chamber (10 of FIG. 1). However, the present disclosure is not limited thereto.

In some embodiments, application of the physical impact to the filter unit 120 using the filter knocker 470 may be performed, while an ALD process is being performed inside the process chamber (10 of FIG. 1). In some embodiments, application of the physical impact to the filter unit 120 using the filter knocker 470 may be performed repeatedly at a constant time period, regardless of whether the ALD process is completed inside the process chamber (10 of FIG. 1).

Hereinafter, a scrubber according to some embodiments of the present disclosure will be described referring to FIGS. 17 to 19. Differences from the scrubber shown in FIGS. 12 to 15 will be mainly described.

Figure 17:
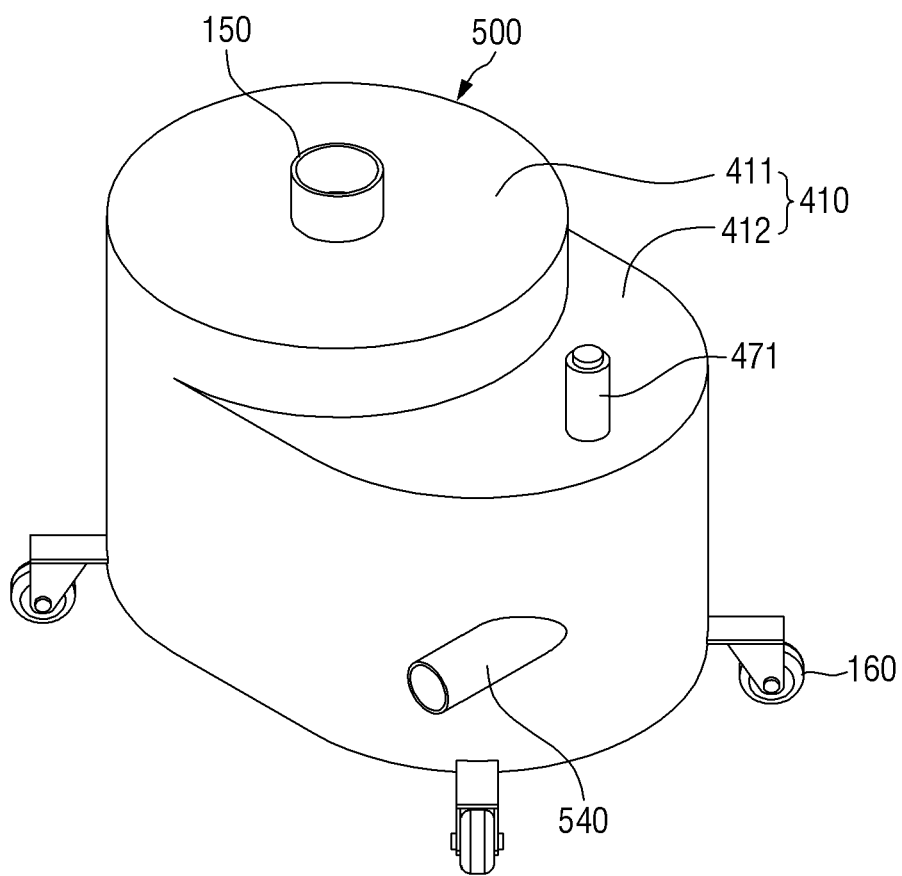
FIG. 17 is a perspective view for explaining a scrubber according to some embodiments of the present disclosure.

FIG. 17 is a perspective view for explaining a scrubber according to some embodiments of the present disclosure. FIG. 18 is a plan view for explaining the scrubber shown in FIG. 17. FIG. 19 is a diagram for explaining an internal structure of the scrubber shown in FIG. 17.

Figure 18:
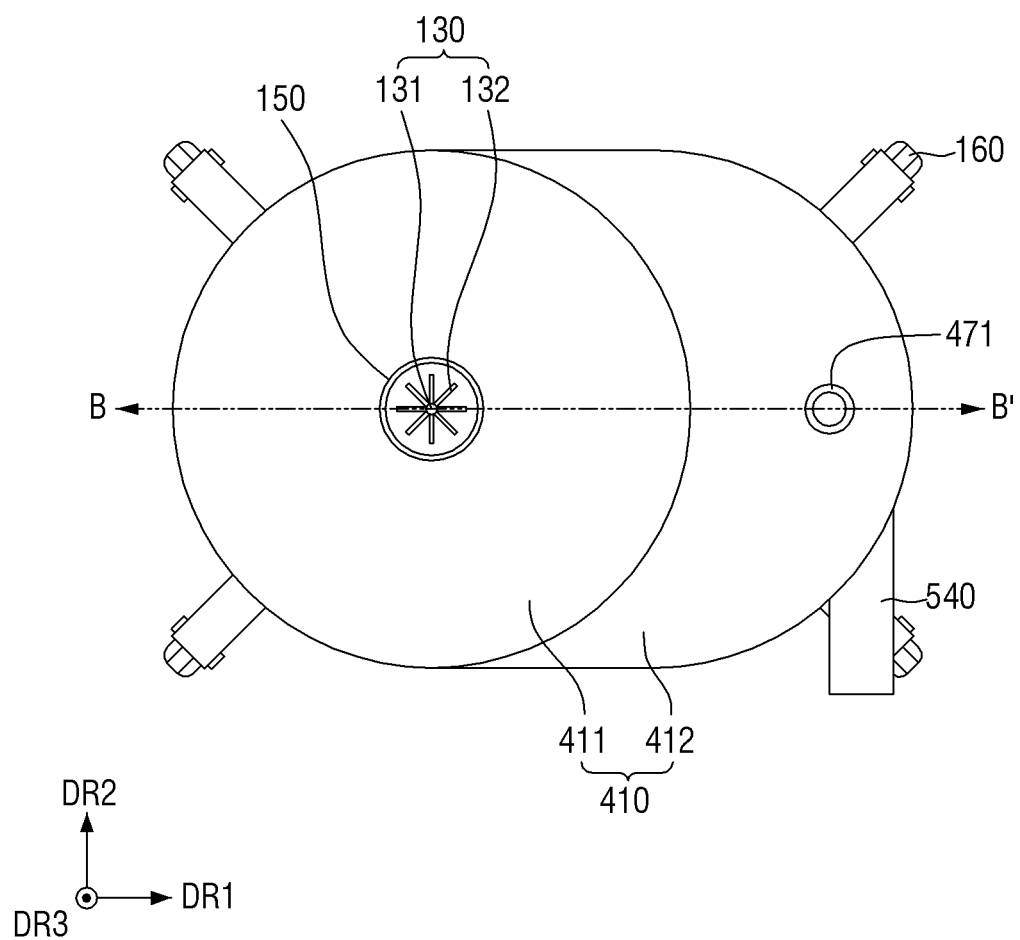
FIG. 18 is a plan view for explaining the scrubber shown in FIG. 17.
Figure 19:
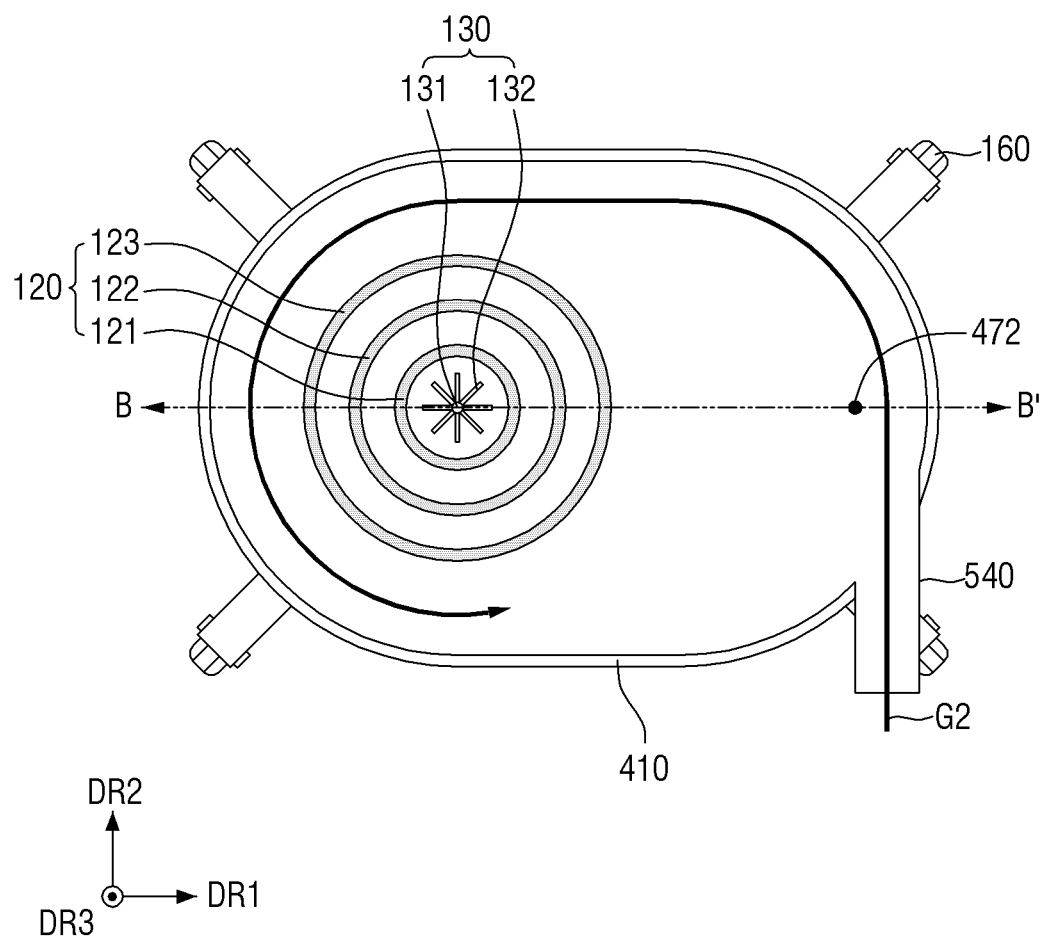
FIG. 19 is a diagram for explaining an internal structure of the scrubber shown in FIG. 17.

Referring to FIGS. 17 to 19, in a scrubber 500 according to some embodiment of the present disclosure, the process gas flows into a housing 410 through a gas inlet 540 in a second direction DR2, and a gas inlet 540 does not overlap the filter unit 120 in the second direction DR2.

The gas inlet 540 may extend, for example, in the second direction DR2 and be connected to the side wall of the second portion 412 of the housing 410. The process gas provided from the process chamber (10 of FIG. 1) may be provided to the inside of the second portion 412 of the housing 410 through the gas inlet 540 in the second direction DR2. The process gas provided to the inside of the second portion 412 of the housing 410 circulates between the inner wall of the housing 410 and the filter unit 120 along a process gas inflow path G2.

The scrubber 500 may include a filter knocker 470 including a manipulation unit 471 and a drive unit 472, similarly to the scrubber 400 shown in FIGS. 12 to 15.

In the scrubber 500 according to some embodiment of the present disclosure, the gas inlet 540 may be connected to the housing 410 so that the process gas provided to the inside of the housing 410 is not provided perpendicularly to the side wall of the filter unit 120 to prevent the filtering efficiency of the portion of the filter unit 120 adjacent to the gas inlet 540 from being relatively lowered.

Further, similarly to the scrubber 400 shown in FIGS. 12 to 15, the scrubber 500 according to some embodiments of the present disclosure may manipulate filter knocker 470 to apply a physical impact to the filter unit 120, thereby desorbing the powder adsorbed to each of the first to third filters 121, 122, and 123. As a result, it is possible to prevent the filtering efficiency of each of the first to third filters 121, 122, and 123 from being lowered due to the adsorption of the powder.

Hereinafter, a scrubber according to some embodiments of the present disclosure will be described referring to FIG. 20. Differences from the scrubber shown in FIGS. 2 to 6 will be mainly described.

Figure 20:
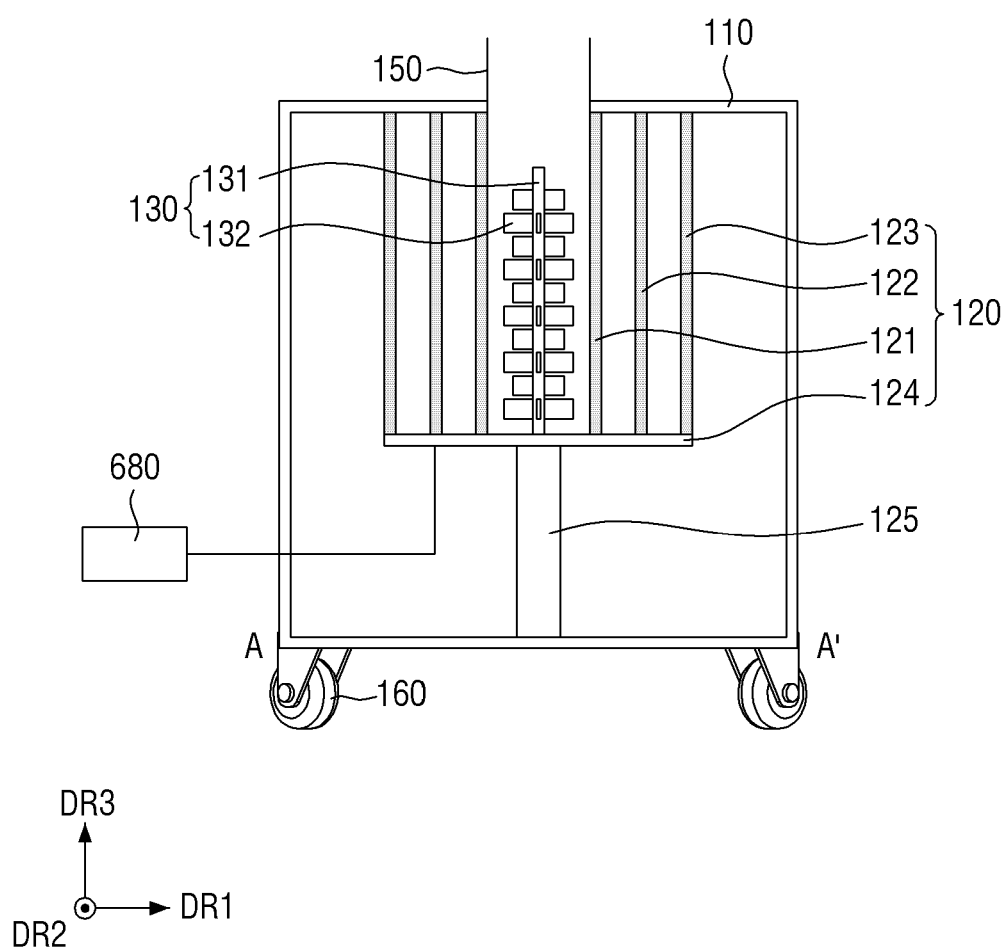
FIG. 20 is a cross-sectional view for explaining a scrubber according to some embodiment of the present disclosure.

FIG. 20 is a cross-sectional view for explaining a scrubber according to some embodiment of the present disclosure.

Referring to FIG. 20, the scrubber according to some embodiments of the disclosure may include a vibration module 680 that transmits vibration to the filter unit 120.

The vibration module 680 may be connected to the filter unit 120. For example, the vibration module 680 may be connected to the filter plate 124. Although FIG. 20 shows that the vibration module 680 is disposed outside the housing 110, this is an example, and the vibration module 680 may be installed in any location (e.g., the inside of the housing 110) to transmit vibration to the filter unit 120.

The operator may manually manipulate the vibration module 680 to transmit the vibration to the filter unit 120. However, the present disclosure is not limited thereto. In some embodiments, the vibration module 680 may be manipulated automatically through a control system.

A scrubber according to some embodiment of the present disclosure may manipulate the vibration module 680 to transmit vibration to the filter unit 120, thereby desorbing the powder adsorbed to each of to the first to third filters 121, 122, and 123. As a result, it is possible to prevent the filtering efficiency of each of the first to third filters 121, 122, and 123 from being lowered due to the adsorption of the powder.

Hereinafter, an ALD process system according to some embodiments of the present disclosure will be described referring to FIG. 21. Differences from the ALD process system shown in FIG. 1 and the scrubber shown in FIGS. 2 to 6 will be mainly described.

Figure 21:
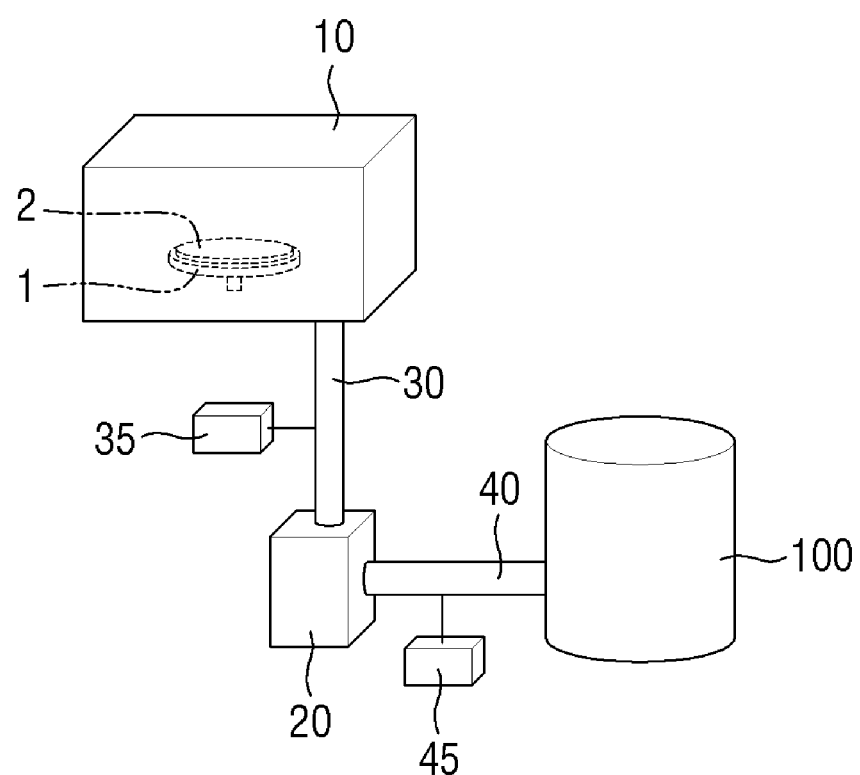
FIG. 21 is a diagram for schematically explaining an ALD process system according to some embodiments of the present disclosure.

FIG. 21 is a diagram for schematically explaining an ALD process system according to some embodiments of the present disclosure.

Referring to FIG. 21, the ALD process system according to some embodiment of the present disclosure may include a first heater 35 and a second heater 45.

The first heater 35 may be installed on the first pipe 30. The first heater 35 may heat the first pipe 30 to prevent the powder contained in the process gas from being accumulated inside the first pipe 30. The second heater 45 may be installed on the second pipe 40. The second heater 45 may heat the second pipe 40 to prevent the powder contained in the process gas from being accumulated inside the second pipe 40.

In the ALD process system according to some embodiments of the present disclosure, the pipes 30 and 40 through which the process gas passes may be heated using the heaters 35 and 45 to prevent to powder contained in the process gas from being accumulated inside the pipes 30 and 40 and improve the process efficiency.

In concluding the detailed description, those skilled in the art will appreciate that many variations and modifications may be made to the embodiments without substantially departing from the principles of the present disclosure. Therefore, the disclosed embodiments of the disclosure are used in a generic and descriptive sense only and not for purposes of limitation.

What is claimed is:

1. A method of fabricating a semiconductor device, the method comprising:
    providing a wafer inside a process chamber;
    performing an ALD (atomic layer deposition) process inside the process chamber to deposit titanium nitride on the wafer;
    providing a process gas used for the ALD process to a scrubber;
    filtering a first powder contained in the process gas, using a filter unit disposed in the scrubber and including a plurality of filters allowing the process gas to pass through;
    adsorbing a second powder remaining in the process gas after passing through the filter unit, using a fin structure extending in a vertical direction inside the filter unit; and
    exhausting the process gas, from which the first and second powders are removed, from the scrubber.

2. The method of fabricating the semiconductor device of claim 1,
    wherein the filter unit includes a first filter, and a second filter surrounding the first filter,
    wherein the process gas sequentially pass through the second filter and the first filter to be provided to the fin structure.

3. The method of fabricating the semiconductor device of claim 1,
wherein the process gas provided to the scrubber is provided to the scrubber through a gas inlet extending in a first direction, and
wherein the gas inlet does not overlap the filter unit in the first direction.

4. The method of fabricating the semiconductor device of claim 1, further comprising:
after exhausting the process gas from the scrubber, applying a physical impact to the filter unit to desorb the first powder adsorbed to the plurality of filters.

5. A scrubber comprising:
a housing connected to a process chamber in which an ALD (atomic layer deposition) process is performed;
a filter unit which is disposed inside the housing, and includes a first filter and a second filter surrounding the first filter, which are configured to allow a process gas to pass through and filter a first powder from the process gas received from the process chamber;
a gas inlet which is connected to the housing, and is configured to receive the process gas from the process chamber and provide the process gas to the filter unit; and
a fin structure that extends in a vertical direction inside the first filter, and is configured to adsorb a second powder remaining in the process gas after passing through the first filter.

6. The scrubber of claim 5,
wherein the fin structure includes:
a fin extending in the vertical direction; and
a plurality of blades protruding laterally from the fin.

7. The scrubber of claim 5,
wherein the fin structure includes:
a fin extending in the vertical direction, and
a blade disposed spirally along the fin.

8. The scrubber of claim 5,
wherein the gas inlet extends in a first direction,
wherein the process gas received from the process chamber is provided to the housing through the gas inlet in the first direction, and
wherein the gas inlet does not overlap the filter unit in the first direction.

9. The scrubber of claim 5, further comprising:
a filter knocker which is connected to the filter unit and is configured to apply a physical impact to the filter unit to desorb the first powder adsorbed to the first and second filters.

10. The scrubber of claim 9,
wherein the filter knocker includes:
a manipulation unit exposed on an outer wall of the housing; and
a drive unit which is disposed inside the housing, includes a first end connected to the filter unit and a second end connected to the manipulation unit, and has a line shape.

11. The scrubber of claim 5, further comprising:
a vibration module which is connected to the filter unit, and is configured to transmit vibration to the filter unit to desorb the first powder adsorbed to the first and second filters.

12. The scrubber of claim 5, further comprising:
a gas outlet which is connected to the housing and is configured to exhaust the process gas, from which the first and second powders are removed, to the outside of the scrubber,
wherein the fin structure overlaps the gas outlet in the vertical direction.

13. The scrubber of claim 5,
wherein the fin structure is spaced apart from the first filter.

14. The scrubber of claim 5,
wherein each of the first filter and the second filter has a cylindrical shape.

15. An atomic layer deposition (ALD) process system comprising:
a process chamber in which an ALD process is performed to deposit titanium nitride on a wafer;
a scrubber which is connected to the process chamber, and is configured to accommodate a process gas provided from the process chamber to remove a powder contained in the process gas; and
a pump configured to supply the process gas provided from the process chamber to the scrubber,
wherein the scrubber includes:
a housing,
a filter unit which is disposed inside the housing and is configured to allow the process gas to pass through and filter a first powder of the powder from the process gas, and
a fin structure which extends in a vertical direction inside the filter unit, and is configured to adsorb a second powder of the powder remaining in the process gas after passing through the filter unit.

16. The ALD process system of claim 15, further comprising:
a first pipe which connects the process chamber to the pump;
a second pipe which connects the pump to the scrubber;
a first heater installed on the first pipe to heat the first pipe; and
a second heater installed on the second pipe to heat the second pipe.

17. The ALD process system of claim 15,
wherein the fin structure includes:
a fin extending in the vertical direction, and
a plurality of blades protruding laterally from the fin.

18. The ALD process system of claim 15,
wherein the scrubber further includes a gas inlet which is configured to accommodate the process gas and provide the process gas to the filter unit, and
wherein the process gas provided from the process chamber is provided to the housing in a first direction through the gas inlet, and the gas inlet does not overlap the filter unit in the first direction.

19. The ALD process system of claim 15, further comprising:
a filter knocker which is connected to the filter unit and is configured to apply a physical impact to the filter unit to desorb the first powder adsorbed to a plurality of filters included in the filter unit.

20. The ALD process system of claim 15,
wherein the filter unit includes a first filter, and a second filter surrounding the first filter, and
wherein each of the first filter and the second filter has a cylindrical shape.

* * * * *